United States Patent
Nemoto et al.

(10) Patent No.: US 6,631,807 B2
(45) Date of Patent: Oct. 14, 2003

(54) CHIP TRAY

(75) Inventors: Masahisa Nemoto, Tokyo (JP); Toshihiko Ichioka, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/832,120

(22) Filed: Apr. 11, 2001

(65) Prior Publication Data

US 2001/0030144 A1 Oct. 18, 2001

(30) Foreign Application Priority Data

Apr. 12, 2000 (JP) ........................................ 2000-110817

(51) Int. Cl.[7] .............................................. B65D 85/30
(52) U.S. Cl. ........................ 206/725; 206/714; 206/460
(58) Field of Search ................................ 206/722–723, 206/724, 725, 713, 714, 716, 564, 460, 813; 220/23.87, 23.88, 23.89

(56) References Cited

U.S. PATENT DOCUMENTS

| | | | | |
|---|---|---|---|---|
| 3,645,281 A | * | 2/1972 | Seidler | 132/216 |
| 4,122,006 A | * | 10/1978 | Christensen et al. | 209/322 |
| 4,298,120 A | * | 11/1981 | Kaneko et al. | 206/389 |
| 4,589,547 A | * | 5/1986 | Stewart et al. | 206/518 |
| 4,657,137 A | * | 4/1987 | Johnson | 206/460 |
| 5,089,314 A | * | 2/1992 | Masujima et al. | 428/156 |
| 5,234,104 A | * | 8/1993 | Schulte et al. | 206/714 |
| 5,408,121 A | * | 4/1995 | Nakamura et al. | 257/433 |
| 5,648,136 A | * | 7/1997 | Bird | 206/562 |
| 5,682,731 A | * | 11/1997 | Althouse | 206/713 |
| 5,857,572 A | * | 1/1999 | Bird et al. | 206/713 |
| 6,029,427 A | * | 2/2000 | Freund et al. | 206/460 |
| 6,107,680 A | * | 8/2000 | Hodges | 206/724 |

FOREIGN PATENT DOCUMENTS

JP 298080 A * 10/2001

* cited by examiner

*Primary Examiner*—J. Mohandesi
(74) *Attorney, Agent, or Firm*—Kanesaka & Takeuchi

(57) ABSTRACT

A chip tray includes a first member (11) having an adhesive (13) on an upper face thereof and a second member (12) having upper and lower faces and at least one chip carrying section (14) having a through hole (15) extending downwardly from a bottom of the chip carrying section to the lower face of the second member. The second member is placed upon the first member such that the upper face of the first member is opposed to the lower face of the second member.

8 Claims, 3 Drawing Sheets

CHIP TRAY

BACKGROUND OF THE INVENTION

1. Field of the Invention

The present invention relates to chip trays for carrying semiconductor chips.

2. Description of the Related Art

There are many types of chip trays for carrying semiconductor chips.

FIGS. 4(A) and 4(B) show an example thereof. This chip tray comprises a flat member 41, and a plurality of chip carrying sections 42 provided in the flat member 41 for carrying semiconductor chips therein. The shape and size of the chip carrying sections 42 are determined according to the chips to be carried.

However, the conventional chip tray has the following disadvantage.

Semiconductor chips are made by cutting a semiconductor wafer, producing dust from the side and back faces of the semiconductor chips. When the semiconductor chips are placed on the chip tray, the dust falls from the semiconductor chips by vibrations of the chip tray and adheres to the circuit forming faces of the semiconductor chips, damaging the circuits made on the semiconductor chips. Also, it causes appearance defects and/or difficulties in bonding wires to the circuits.

SUMMARY OF THE INVENTION

Accordingly, it is an object of the invention to provide a chip tray capable of carrying semiconductor chips without dust adhesion.

According to the invention there is provided a chip tray which comprises a substantially flat member with at least one chip carrying section having a recess therein, wherein an adhesive is provided in a bottom of the recess.

DESCRIPTION OF THE PREFERRED EMBODIMENTS

Figure 1A:
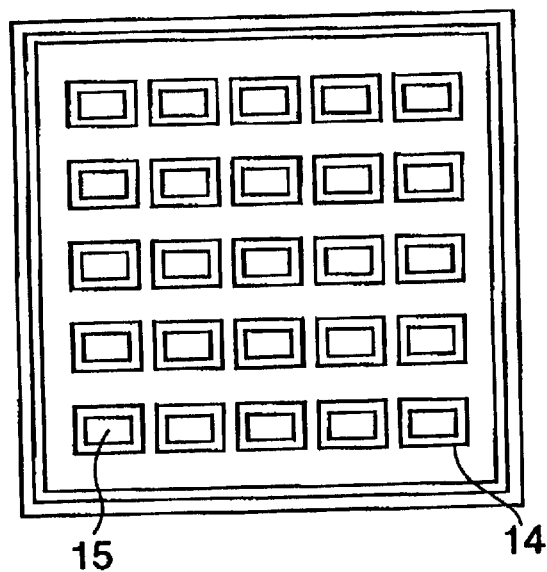
FIG. 1(A) is a top plan view of a chip tray according to the first embodiment of the invention.
Figure 1B:
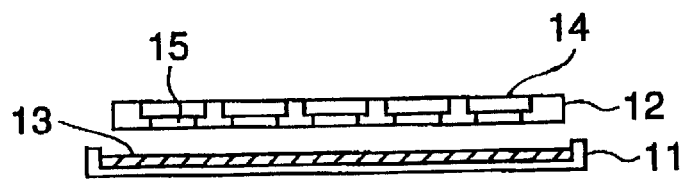
FIG. 1(B) is a side elevational view of the chip tray.

In FIGS. 1(A) and (B), a chip tray comprises a first member 11 and a second member 12 for carrying semiconductor chips. The first member 11 is substantially flat and is coated with an adhesive 13 on the upper face. The second member 12 is also a substantially flat and has a plurality of chip carrying sections 14. The first and second members 11 and 12 are made of a material, such as styrene, polycarbonate, or polypropylene. Each chip carrying section 14 has a through hole 15 extending downwardly to the lower face. The second member 12 is placed on the first member 11.

When semiconductor chips are placed on the chip carrying sections 14, dust falls from the side and back faces of the semiconductor chips through the through holes 15 onto the adhesive 13 so that the dust is prevented from adhering to the circuit forming faces of the semiconductor chips.

According to the first embodiment of the invention, the dust from the side and back faces of semiconductor chips is caught by the adhesive 13 so that it is possible to prevent the dust from adhering to the circuit forming faces of the semiconductor chips and damaging the circuits formed on the semiconductor chips. Also, it is possible to eliminate a cause for appearance defects and/or a difficulty in bonding wires to the circuits.

In addition, it is possible to carry different semiconductor chips by simply replacing for the second member 12 another second member 12 with chip carrying sections 14 having shapes and sizes that are different from those of the replaced chip carrying sections 14.

Figure 1C:
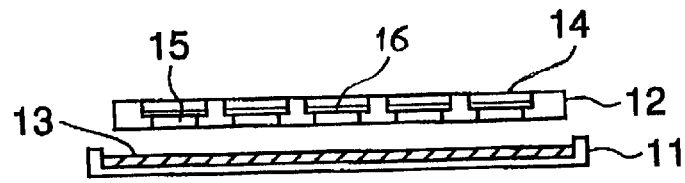
FIG. 1(C) is a side elevational view of a chip tray according to a variation of the first emdobiment of the invention.

Also, as shown in FIG. 1(C), the upper opening of each through hole 15 may be closed with a net, sieve, or wire screen 16 to permit placement of a semiconductor chip smaller than the through hole 15 although dust particles larger than the mesh of the wire screen are blocked from passing through the through hole 15.

Figure 1D:
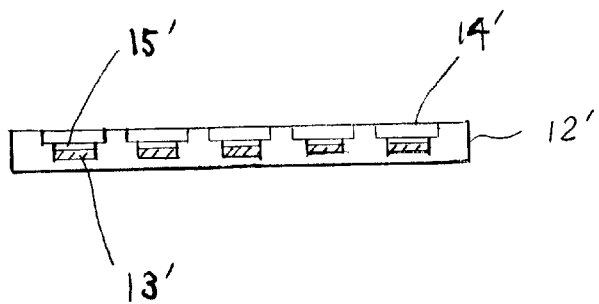
FIG. 1(D) is a side elevational view of a chip tray according to another variation of the first emdobiment of the invention.
Figure 4A:
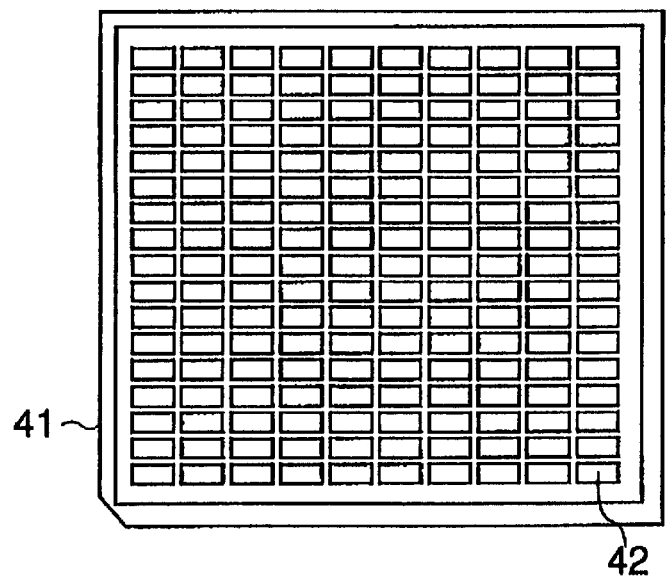
FIG. 4(A) is a top plan view of the conventional chip tray.
Figure 4B:
FIG. 4(B) is a side elevational view of the conventional chip tray.

As shown in FIG. 1(D), the through holes 15 may be replaced by recesses 15' having adhesive 13' on the bottom, thus eleimnating the first member 11.

Figure 2:
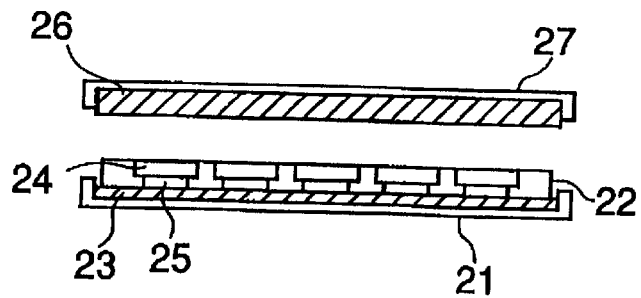
FIG. 2 is a side elevational view of a chip tray according to the second embodiment of the invention.

In FIG. 2, a chip tray according to the second embodiment of the invention has a structure similar to that of the first embodiment and the detailed description is omitted. That is, the first member 21, second member 22, adhesive 23, chip carrying sections 24, and through holes 25 are identical with those of the first embodiment.

According to the second embodiment, a cover 27 with an adhesive 26 is placed over the second member 22. The cover 27 is made of a material such as styrene, polycarbonate, or polypropylene.

The chip tray of the second embodiment has substantially the same advantages as those of the first embodiment. It has the adhesive 20 and 26 above and below the chip carrying sections 24 so that it prevents dust from adhering to the circuit forming faces of semiconductor chips more completely than the first embodiment and eliminates the problem that the circuit formed on the semiconductor chips are damaged.

Alternatively, the adhesive 26 may be replaced by an elastic material, such as silicon rubber, so that the elastic material makes contact with the circuit forming faces of semiconductor chips on the chip carrying sections. Consequently, the circuit forming faces are not exposed to the atmosphere, assuring prevention of the dust adherence to the circuit forming faces. The cover 27 and the adhesive 26 may be used for the conventional chip tray.

Figure 3A:
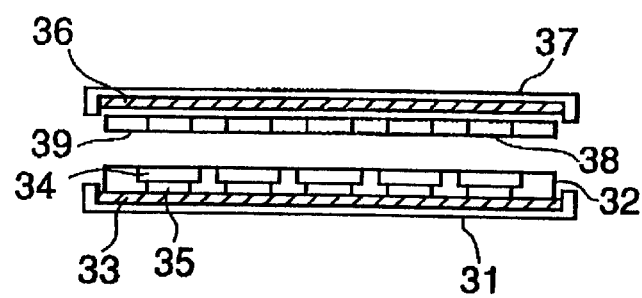
FIG. 3(A) is a side elevational view of a chip tray according to the third embodiment of the invention.

In FIG. 3(A), a chip tray according to the third embodiment of the invention has a structure substantially identical with that of the second embodiment and, therefore, the detailed description is omitted. That is, the first member 31, second member 32, adhesive 33, chip carrying sections 34, through holes 35, adhesive 36, and cover 37 of this embodiment are the same as those of the second embodiment.

In third embodiment, a flat grid 39 with through holes 38 is provided between the second member 32 and the cover 37. The grid 39 is made of a material such as styrene, polycarbonate, or polypropylene.

The chip tray of the third embodiment has substantially the same advantages as those of the second embodiment. The flat grid 39 between the second member 32 and the cover 37 prevents the semiconductor chips on the chip carrying sections 34 from adhering to the adhesive 36. Also, it is possible to carry semiconductor chips of different sizes by simply replacing the grid 39 and the second member 32. The cover 37 and adhesive 36 may be used for the conventional chip tray.

The grid 39 may be bonded to the cover 37, reducing the number of components of the chip tray and preventing loss of any component.

Figure 3B:
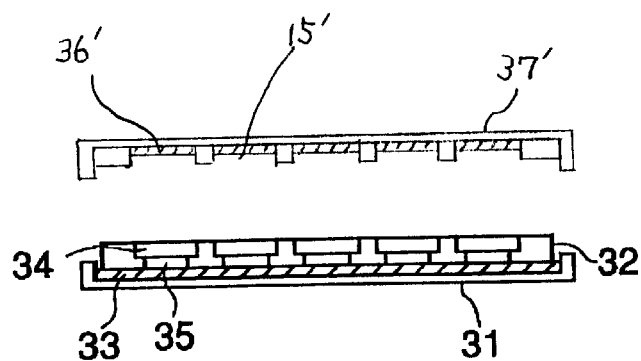
FIG. 3(B) is a side elevational view of a chip tray according to a variation of the third embodiment of the invention.

Alternatively, as shown in FIG. 3(B), the cover 37' may be provided with recesses 15' in a lower face of the cover 37' at positions corresponding to the chip carrying sections 34. An adhesive 36' is provided in bottoms of the recesses 15'. Then, the cover 37' is placed upon the second member 32 such that the lower face of the cover 37' is opposed to the upper face of the second member 32, thus eliminating the grid 39.

As has been described above, according to the invention, when semiconductor chips are placed on the chip carrying sections of a chip tray, dust falls from the side and back faces of the semiconductor chips through the through holes onto the adhesive so that it is prevented from adhering to the circuit forming faces of the semiconductor chips and does not damage the circuits on the semiconductor chips. Also, it neither leads to appearance defects nor difficulty in wire bonding to the circuits.

What is claimed is:

1. A semiconductor chip tray comprising:
    a plate member having front and rear surfaces;
    a semiconductor chip containing portion formed in the front surface of the plate member and having a bottom face;
    a through hole formed in the plate member and extending from the bottom face of the semiconductor chip containing portion to the rear surface of the plate member, wherein the through hole has an area smaller than the bottom face of the semiconductor chip containing portion; and
    an adhesive layer disposed on the rear surface of the plate member so that the adhesive layer covers the through hole.

2. The semiconductor chip tray according to claim 1, further comprising:
    a tray member which receives the plate member, wherein the adhesive layer is disposed between the plate member and the tray member.

3. The semiconductor chip tray according to claim 1, wherein the through hole in the bottom face of the semiconductor chip tray containing portion is covered by a net, sieve, or wire screen.

4. The semiconductor chip tray according to claim 1, wherein the plate member is made of styrene, polycarbonate, or polypropylene.

5. The semiconductor chip tray according to claim 1, further comprising;
    a cover member which covers the front surface of the plate member; and
    an adhesive member or an elastic member disposed between the cover member and the front surface of the plate member.

6. The semiconductor chip tray according to claim 5, the cover member is made of styrene, polycarbonate, or polypropylene.

7. The semiconductor chip tray according to claim 5, further comprising;
    a flat plate having a hole and being disposed between the adhesive member and the front surface of the plate member, wherein the hole is formed at a position corresponding to the semiconductor chip containing portion.

8. The semiconductor chip tray according to claim 7, the flat plate is made of styrene, polycarbonate, or polypropylene.

* * * * *